(12) United States Patent
Agata

(10) Patent No.: US 10,134,846 B2
(45) Date of Patent: Nov. 20, 2018

(54) SEMICONDUCTOR DEVICE

(71) Applicant: FUJI ELECTRIC CO., LTD., Kanagawa (JP)

(72) Inventor: Yasunori Agata, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/853,971

(22) Filed: Dec. 26, 2017

(65) Prior Publication Data

US 2018/0219068 A1 Aug. 2, 2018

(30) Foreign Application Priority Data

Feb. 1, 2017 (JP) .................................. 2017-016470

(51) Int. Cl.
| | |
|---|---|
| *H01L 29/40* | (2006.01) |
| *H01L 29/10* | (2006.01) |
| *H01L 29/06* | (2006.01) |
| *H01L 29/739* | (2006.01) |
| *H01L 29/73* | (2006.01) |
| *H01L 29/66* | (2006.01) |
| *H01L 29/78* | (2006.01) |

(52) U.S. Cl.
CPC ...... *H01L 29/1095* (2013.01); *H01L 29/0692* (2013.01); *H01L 29/402* (2013.01); *H01L 29/66325* (2013.01); *H01L 29/7304* (2013.01); *H01L 29/7397* (2013.01); *H01L 29/7811* (2013.01); *H01L 29/7823* (2013.01)

(58) Field of Classification Search
CPC ............... H01L 29/402; H01L 29/7397; H01L 29/7811; H01L 29/1095; H01L 29/0692; H01L 29/66325; H01L 29/7304; H01L 29/7823
See application file for complete search history.

(56) References Cited

U.S. PATENT DOCUMENTS 5,970,324 A * 10/1999 Driscoll .................. F02P 7/035
257/E29.023
2015/0255362 A1 9/2015 Konrath et al.

FOREIGN PATENT DOCUMENTS

| JP | H04-332173 A | 11/1992 |
|---|---|---|
| JP | H07-254707 A | 10/1995 |
| JP | 2712098 B2 | 2/1998 |
| JP | 3117023 B2 | 12/2000 |

(Continued)

*Primary Examiner* — Fei Fei Yeung Lopez

(57) ABSTRACT

A semiconductor device including a semiconductor substrate having an edge termination portion and an active portion is provided. The edge termination portion includes an outer edge region provided on an end portion of a front surface of the semiconductor substrate and within a predetermined depth range. The active portion includes a well region provided on an inner side relative to the outer edge region of the front surface of the semiconductor substrate and within a predetermined depth range. The semiconductor device further includes an insulating film provided on the front surface of the semiconductor substrate and at least between the outer edge region and the well region and having a taper portion, and a resistive film provided on the insulating film and electrically connected to the outer edge region and the well region. A taper angle of the taper portion of the insulating film is 60 degrees or less.

7 Claims, 8 Drawing Sheets

(56) References Cited

FOREIGN PATENT DOCUMENTS

| JP | 2013-115144 A | 6/2013 |
|----|---------------|--------|
| JP | 2015-170857 A | 9/2015 |

\* cited by examiner

SEMICONDUCTOR DEVICE

The contents of the following Japanese patent applications are incorporated herein by reference:
NO. 2017-016470 filed in JP on Feb. 1, 2017.

BACKGROUND

1. Technical Field

The present invention relates to a semiconductor device.

Resistive films and conductive field plates have been conventionally known as edge termination structures (for example, see Patent Documents 1 and 2).

Patent Document 1: Japanese Patent No. 3117023
Patent Document 2: Japanese Patent No. 2712098

In a resistive film electrically connecting a base region and a stopper region to each other, a potential gradient is formed, depending on a potential difference between the base region and the stopper region. Electric fields may be formed in the resistive film, depending on the potential gradient. Any variation in the potential gradient is desirably adjusted to prevent an avalanche from occurring, due to the electric fields of the resistive film, in a semiconductor substrate located beneath the resistive film.

SUMMARY

A first aspect of the present invention provides a semiconductor device. The semiconductor device may include a semiconductor substrate, an insulating film, and a resistive film. The semiconductor substrate may have an edge termination portion and an active portion. The edge termination portion may include an outer edge region. The outer edge region may be provided on an end portion of a front surface of the semiconductor substrate and within a predetermined depth range. The outer edge region may be an impurity region. The active portion may include a well region. The well region may be provided on an inner side relative to relative to the outer edge region of the front surface of the semiconductor substrate and within a predetermined depth range. The well region may be an impurity region whose conductivity-type is different from that of a drift region of the semiconductor substrate. The insulating film may be provided on the front surface of the semiconductor substrate and at least between the outer edge region and the well region. The insulating film may have a taper portion. A taper angle of the taper portion of the insulating film may be 60 degrees or less. The resistive film may be provided on the insulating film. The resistive film may be electrically connected to the outer edge region and the well region.

A thickness of the insulating film on the front surface of the semiconductor substrate may be 0.5 μm or more.

An upper end and a lower end of the taper portion may be separated, in a direction parallel to the front surface of the semiconductor substrate, from an outer end portion of the well region by a quarter or more of a distance between the outer end portion of the well region of the active portion and the inner end portion of the outer edge region.

An upper end of the taper portion may be, in a direction parallel to the front surface of the semiconductor substrate, closer to the outer edge region than to an intermediate position between the outer end portion of the well region of the active portion and an inner end portion of the outer edge region.

Also, a lower end of the taper portion may be, in a direction parallel to the front surface of the semiconductor substrate, closer to the outer edge region than to an intermediate position between an outer end portion of the well region of the active portion and an inner end portion of the outer edge region.

The insulating film may include a first insulating film and a second insulating film. The first insulating film may have the taper portion. The second insulating film may be located between the first insulating film and the front surface of the semiconductor substrate.

An inner end portion of the insulating film may extend in an inner direction relative to an outer end portion of the well region, and an outer end portion of the insulating film may extend in an outer direction relative to an inner end portion of the outer edge region.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
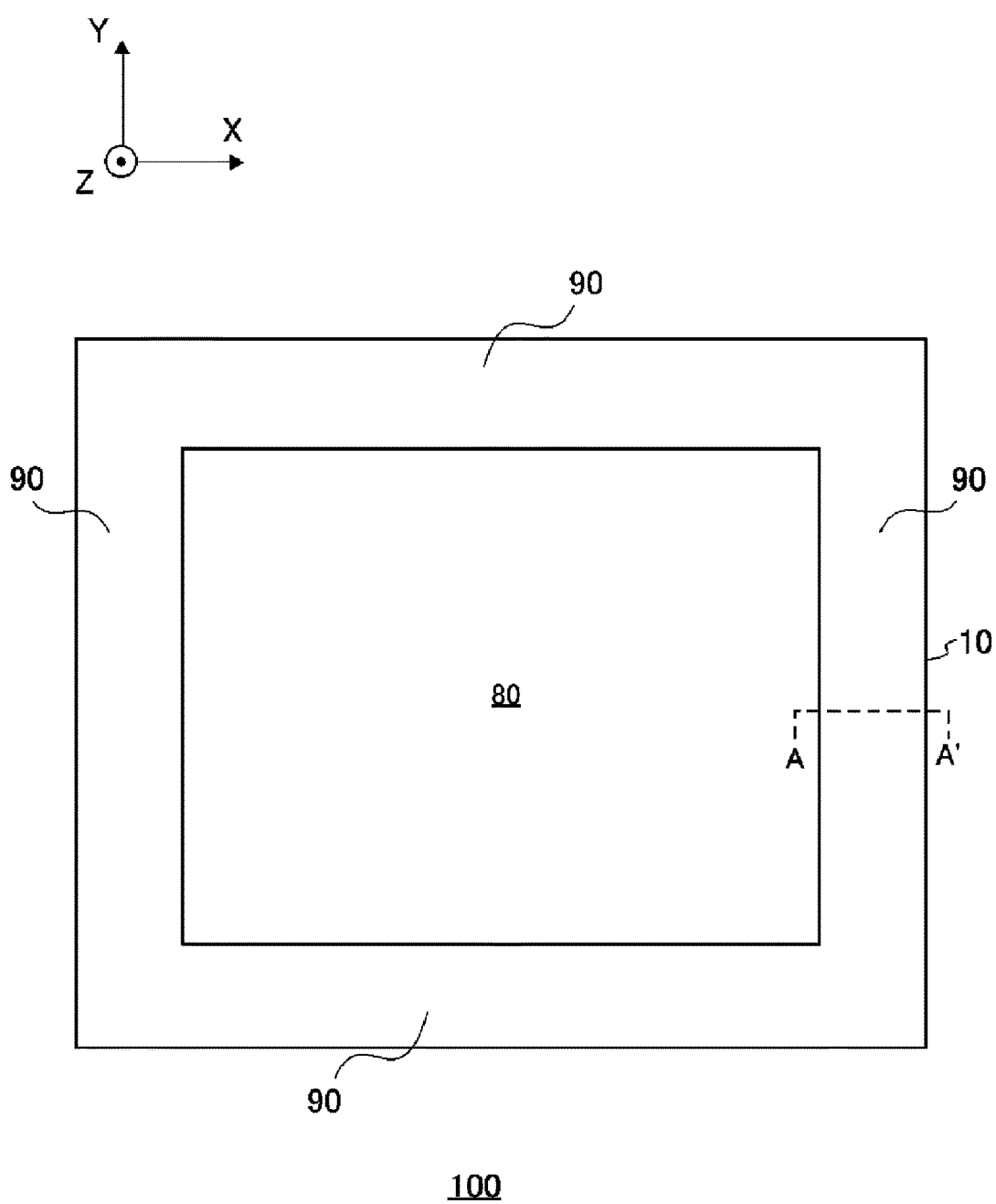
FIG. 1 is a diagram showing the outline of a semiconductor device 100 according to a first embodiment.

FIG. 1 is a diagram showing an outline of an upper front surface of a semiconductor device 100 according to a first embodiment. A semiconductor device 100 of the present example has a semiconductor substrate 10 including an active portion 80 and an edge termination portion 90. The semiconductor substrate 10 may be regarded as a semiconductor chip. The semiconductor substrate 10 of the present example is a silicon substrate.

The active portion 80 may be a region in which currents flow when the semiconductor device 100 is controlled to be in an ON state. The active portion 80 may include a transistor such as an insulated gate bipolar transistor (IGBT) and a metal oxide semiconductor field effect transistor (MOSFET), and a diode such as a free wheeling diode (FWD).

The active portion 80 of the present example has the IGBT. However, the active portion 80 may be the MOSFET or the FWD. Also, the active portion 80 may be a reverse conducting IGBT (RC-IGBT) formed by integrating the IGBT and the FWD. Also, the active portion 80 may have the MOSFET and the FWD or have the IGBT, the MOSFET, and the FWD.

The edge termination portion 90 may be provided, surrounding four sides of the active portion 80 that has a rectangular shape as seen from above. The edge termination portion 90 may have a function of relieving electric field concentration near the upper front surface of the semiconductor substrate 10. The edge termination portion 90 may have one or more of a guard ring, a field plate, a reduced surface field (RESURF), a channel stopper, and a structure that is a combination thereof.

As seen from above, the semiconductor substrate 10 of the present example has four sides parallel to the X-axis and the Y-axis. The X-axis and the Y-axis are axes orthogonal to each other. The X-axis direction and the Y-axis direction are also directions parallel to the front surface of the semiconductor substrate 10. Also, the axis orthogonal to the X-axis and the Y-axis is referred to as the Z-axis. The X-axis direction, the Y-axis direction, and the Z-axis direction form a so-called right hand system.

As used herein, the positive direction of the Z-axis may be referred to as "upper," and the negative direction of the Z-axis may be referred to as "lower." Also, the negative direction of the Z-axis may be referred to as the depth direction of the semiconductor substrate 10. The terms "upper" and "lower" are expressions merely for convenience to specify the relative positional relationship among the substrate, regions, a layer, films, and the like. For example, the Z-axis direction does not necessarily mean a direction vertical to the gravitational direction or the ground.

Figure 2:
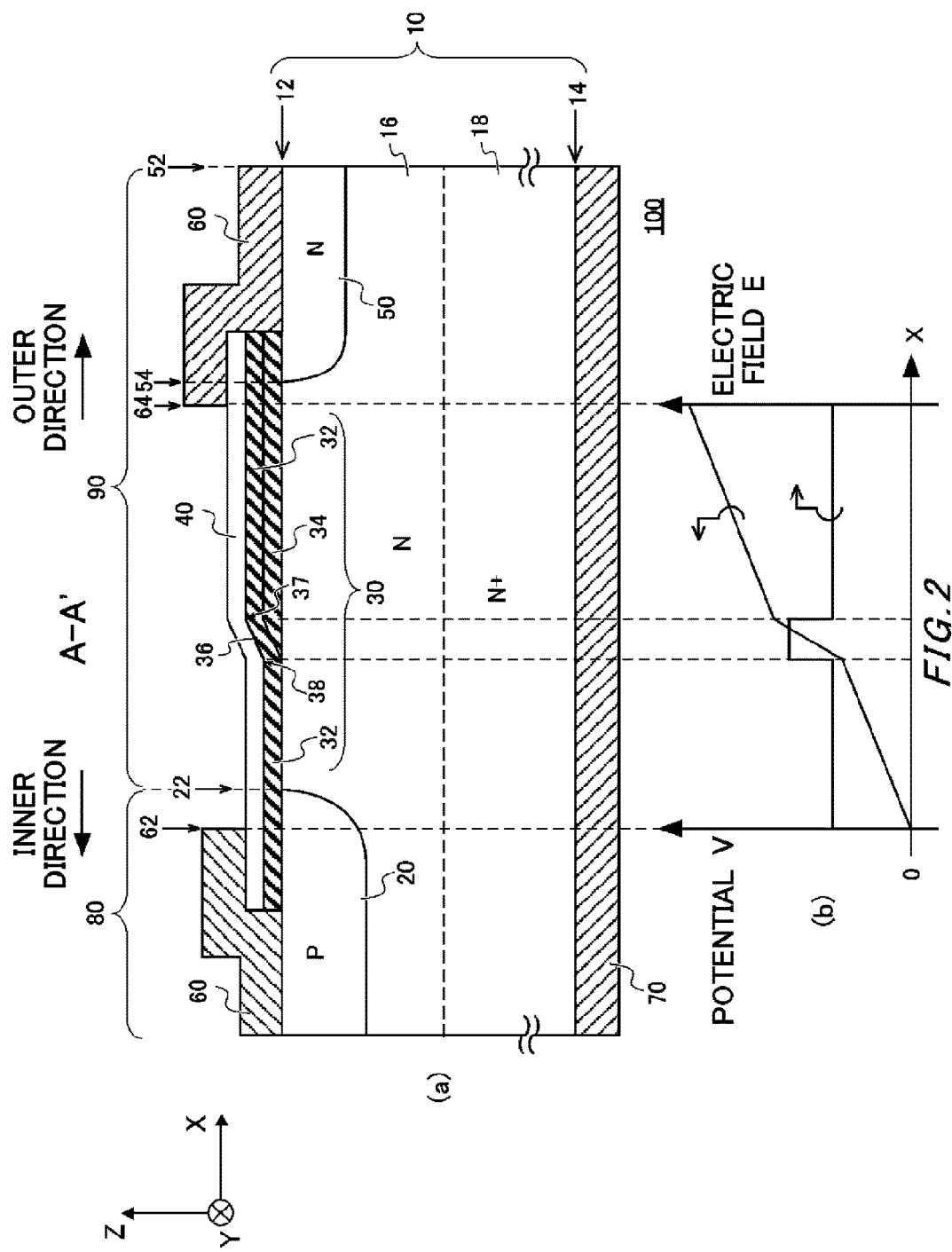
FIG. 2 is a diagram showing (a) a cross section taken along A-A' in FIG. 1 and (b) the outline of the potential V and the electric field E in a resistive film 40.

FIG. 2 is a diagram showing (a) a cross section taken along A-A' in FIG. 1. The Cross section taken along A-A' is a cross section parallel to the X-Z plane that extends horizontally along the edge termination portion 90. The semiconductor substrate 10 has a front surface 12 at the end portion of the positive direction of the Z-axis, and a back surface 14 at the end portion of the negative direction of the Z-axis. The semiconductor substrate 10 of the present example is a first-conductivity-type semiconductor substrate having at least a second-conductivity-type well region 20 formed on the front surface side thereof. Specifically, the semiconductor substrate 10 has an N-type drift region 16 exposed on the front surface 12, a P-type well region 20 and an N-type outer edge region 50, and an $N^+$-type collector region 18 exposed on the back surface 14. The well region 20 of the present example is an example of a second-conductivity-type region, and is an impurity region whose conductivity-type is different from that of the drift region 16 of the semiconductor substrate 10. The drift region 16 and the well region 20 of the present example are respectively provided such that they extend from the front surface 12 to a predetermined depth. The depth position of the drift region 16 and the depth position of the well region 20 may be different from each other.

The first conductivity-type is N-type and the second conductivity-type is P-type in the present example, but the first conductivity-type may be P-type and the second conductivity-type may be N-type in other examples. The symbols "N" and "P" respectively denote that electron is majority carrier and that positive hole is majority carrier. The signs "+" and "−" each following the symbols "N" and "P" respectively denote that the symbols followed by "+" are indicative of a carrier concentration higher than that indicated by the symbols not followed by "+" and that the symbols followed by "−" are indicative of a carrier concentration lower than that indicated by the symbols not followed by "−."

The active portion 80 of the present example includes the well region 20 that is a P-type impurity region. The well region 20 is provided on the front surface 12 and within a predetermined depth range. The well region 20 is provided on the inner side relative to the outer edge region 50 provided in the edge termination portion 90. In the present example, the outer end portion 22 of the well region 20 is regarded as the boundary between the active portion 80 and the edge termination portion 90.

Since the active portion 80 of the present example has the IGBT, the well region 20 may be the P-type base region of the IGBT. However, in the other examples, the well region 20 may be the P-type base region of the MOSFET or may be the P-type body region of the FWD.

As used herein, the direction from the active portion 80 toward the edge termination portion 90 is referred to as an outer direction, and the direction from the edge termination portion 90 toward the active portion 80 is referred to as an inner direction. The outer direction and the inner direction may be similarly defined also in the negative direction of the X-axis, and the positive and negative directions of the Y-axis.

The edge termination portion 90 of the present example includes the outer edge region 50 that functions as the channel stopper region. In order not to allow a depletion layer expanding from the well region 20 toward the outer direction to reach the end portion of the semiconductor substrate 10 in the outer direction, the outer edge region 50 may have a function of preventing further expansion of the depletion layer. The outer edge region 50 is provided on the outer area of the rectangle in the X-Y plane of the semiconductor substrate 10. The outer edge region 50 of the present example is provided on the end portion of the front surface 12 and within a predetermined depth range. The outer edge region 50 may be provided within a depth range of several micrometers from the front surface 12. The outer edge region 50 of the present example is an impurity region that has an N-type impurity concentration higher than that of the drift region 16. In the other examples, the outer edge region 50 may be a $P^+$-type impurity region.

The outer end portion 52 of the outer edge region 50 may coincide with the outer end portion of the semiconductor substrate 10. Also, the end portion of the outer edge region 50 in the inner direction is referred to as an inner end portion 54. In the present example, the distance from the outer end portion 52 to the inner end portion 54 of the outer edge region 50 is about 20 μm. In the present example, the outer edge region 50 and the well region 20 may be separated from each other by a predetermined distance. In the present example, the distance between the inner end portion 54 of the outer edge region 50 and the outer end portion 22 of the well region 20 is about 200 μm.

The semiconductor device 100 of the present example further includes an insulating film 30, a resistive film 40, front surface electrodes 60, and a back surface electrode 70. The insulating film 30 has a first insulating film 32 and a second insulating film 34. In the present example, the first insulating film 32 has a taper portion 36. In the present example, the taper angle θ of the taper portion 36 is an angle formed by a line connecting the upper end 37 and the lower end 38 of the taper portion 36 and the front surface 12 of the semiconductor substrate 10. The second insulating film 34 has a taper portion directly beneath the taper portion 36 of the first insulating film 32. The taper angle of the taper portion of the second insulating film 34 may be reflected in the taper angle θ of the taper portion 36 of the first insulating film 32. The second insulating film 34 is provided within a range narrower than that of the first insulating film 32. The inner end portion of the second insulating film 34 may terminate directly beneath the taper portion 36 of the first insulating film 32. The second insulating film 34 of the present example is located between the first insulating film 32 and the front surface 12 of the semiconductor substrate 10.

The insulating film 30 may have an electrical resistance higher than that of the resistive film 40. In other words, the second insulating film 34 may not be a conduction path between the well region 20 and the outer edge region 50. The first insulating film 32 and the second insulating film 34 may both be a silicon oxide film. In the present example, the first insulating film 32 is a silicon dioxide ($SiO_2$) film, a PSG film, a BSG film or a BPSG film, and the second insulating film 34 is a silicon dioxide film.

The insulating film 30 may be provided on the front surface 12 and continuously at least between the outer edge region 50 and the well region 20. In the present example, the inner end portion of the second insulating film 34 is located outside the outer end portion 22 of the well region 20, and the inner end portion of the first insulating film 32 extends in the inner direction relative to the outer end portion 22 of the well region 20. Also, in the present example, the outer end portions of the first insulating film 32 and the second insulating film 34 are located identically (i.e., flush) in the X-axis direction and extend in the outer direction relative to the inner end portion 54 of the outer edge region 50. In the present example, since the inner end portion of the insulating film 30 extends in the inner direction relative to the outer end portion 22 of the well region 20, and the outer end portion of the insulating film 30 extends in the outer direction relative to the inner end portion 54 of the outer edge region 50, the front surface 12 between the well region 20 and the outer edge region 50 can be more properly insulated by the insulating film 30.

The insulating film 30 of the present example has the taper portion 36 and is thus different from conventional flat insulating films. The insulating film 30 has the taper portion 36 and thereby has a region with a thickness corresponding only to the first insulating film 32 and a region with a thickness corresponding to the first insulating film 32 and the second insulating film 34.

The difference in thickness in the insulating film 30 may be utilized in forming the guard ring. For example, an energy at which ions used to form the guard ring are implanted is adjusted such that the guard ring penetrates through the thickness of the first insulating film 32 and does not penetrate through the thickness of the first insulating film 32 and the second insulating film 34. In the present example, forming the guard ring is not an essential requirement. Even if the guard ring is not formed, it is in some cases advantageous that the insulating film 30 can be formed by the same manufacturing process as that used when forming the guard ring. For example, it is in some cases desirable, in terms of maintaining the operational reliability and the yield of the semiconductor device 100, not to change the manufacturing process of the insulating film 30 irrespective of whether the guard ring is present or not.

The resistive film 40 may be provided continuously on the insulating film 30. The resistive film 40 of the present example directly contacts each of the upper portion of the first insulating film 32 located on the inner side of the taper portion 36, the taper portion 36 of the first insulating film 32, and the upper portion of the first insulating film 32 located outside the taper portion 36. The resistive film 40 may be sufficiently thin to extend, on the taper portion 36, in a direction different from original one so as to reflect the taper angle θ of the taper portion 36. The resistive film 40 may have a thickness approximately equal to that of the first insulating film 32. The resistive film 40 may have a thickness of 0.5 μm or more and 1.5 μm or less. The resistive film 40 of the present example has a thickness of 0.8 μm.

The inner end portion of the resistive film 40 of the present example is, in the X-axis direction, located identically to the inner end portion of the first insulating film 32. Also, the outer end portion of the resistive film 40 of the present example is, in the X-axis direction, located identically to the outer end portions of the first insulating film 32 and the second insulating film 34.

The resistive film 40 may be a film having a resistance of several mega (M) ohms. The symbol "M" is a prefix in the International System of Units (SI). The prefix denotes 10 to the sixth power. The resistive film 40 of the present example is a silicon nitride film. The silicon nitride film of the present example may be an amorphous film or may be a monocrystalline film or a polycrystalline film. The resistive film 40 is not limited to the silicon nitride film, and may be a resistive film consisting of another material and having a resistance of several M ohms.

The front surface electrode 60 is provided in the active portion 80. The front surface electrode 60 of the active portion 80 directly contacts at least the resistive film 40, and a portion of the well region 20 exposed on the front surface 12. In the present example, the outer end portion 62 of the front surface electrode 60 of the active portion 80 is located in the inner direction relative to the outer end portion 22 of the well region 20.

The front surface electrode 60 is provided also in the edge termination portion 90. The front surface electrode 60 of the edge termination portion 90 directly contacts at least the resistive film 40, and a portion of the outer edge region 50 exposed on the front surface 12. In the present example, the inner end portion 64 of the front surface electrode 60 of the edge termination portion 90 is located in the inner direction relative to the inner end portion 54 of the outer edge region 50.

The front surface electrode 60 of the active portion 80 and the front surface electrode 60 of the edge termination portion 90 may be discontinuous on the resistive film 40. In the present example, no front surface electrode 60 is present between the outer end portion 62 of the front surface electrode 60 of the active portion 80 and the inner end portion 64 of the front surface electrode 60 of the edge termination portion 90. Accordingly, the well region 20 and the outer edge region 50 are electrically connected to each other via the front surface electrode 60 of the active portion 80, the resistive film 40, and the front surface electrode 60 of the edge termination portion 90.

The front surface electrode 60 of the active portion 80 may be considered to have the same potential (for example, ground potential) in the inner direction relative to the outer end portion 62. Also, the front surface electrode 60 in the edge termination portion 90 may be considered to have the same potential (for example, the same potential as that of the back surface electrode 70) from the inner end portion 64 to the outer end portion 52.

The front surface electrode 60 of the active portion 80 and the front surface electrode 60 of the edge termination portion 90 may be formed at one time in the same process. The front surface electrode 60 may be an aluminum film or an aluminum-silicon alloy film. In the present example, the front surface electrode 60 of the active portion 80 is an emitter electrode.

The back surface electrode 70 of the present example is a collector electrode to which a voltage of several hundred volts to one thousand and several hundred volts is to be applied. The front surface electrode 60 of the edge termination portion 90 may have the same potential as that of the back surface electrode 70 via the outer end portion of the semiconductor substrate 10. This consequently forms a potential gradient from the outer end portion 62 of the front surface electrode 60 of the active portion 80 to the inner end portion 64 of the front surface electrode 60 of the edge termination portion 90.

FIG. 2 is a diagram showing (b) the outline of the potential V and the electric field E in the resistive film 40. The horizontal axis indicates the length [μm] in the X-axis direction. The vertical axis indicates the potential V in the left side of the graph and the electric field E in the right side of the graph. The zero point in the X-axis direction is regarded as coinciding with the outer end portion 62 of the front surface electrode 60 of the active portion 80. Also, the right end in the X-axis direction is regarded as coinciding with the inner end portion 64 of the front surface electrode 60 of the edge termination portion 90. In (b) of FIG. 2, although description is given with the X-axis being the horizontal axis, the same description holds also when the Y-axis is the horizontal axis.

When the outer shape of the resistive film 40 is linearly approximated as seen in cross section, the resistive film 40 may have a resistance whose value is constant per unit length. Accordingly, the potential of the resistive film 40 may vary at a constant slope from the active portion 80 to the edge termination portion 90. However, the resistive film 40 on the taper portion 36 extends also in the Z-axis direction in addition to the X-axis direction. Accordingly, a variation in the potential V (slope) in the X-axis direction is larger in the taper portion 36 compared to those in regions other than the taper portion 36.

Since the slope of the potential V of the resistive film 40 in the X-axis direction varies in the taper portion 36 in this manner, the electric field E of the resistive film 40 is discontinuous in the taper portion 36. In the present example, the electric field E of the resistive film 40 has an upwardly-convex rectangular wave shape in the taper portion 36. Accordingly, the electric field E is stronger near the front surface 12 of the semiconductor substrate 10 and directly beneath the taper portion 36 than directly beneath areas other than the taper portion 36. In this manner, electric fields may locally concentrate directly beneath the taper portion 36.

Depending on the density of a doped impurity, the silicon substrate has a dielectric breakdown electric field strength of about 0.25 to 0.3 [MV/cm]. The resistive film 40 has a function of expanding the depletion layer in the edge termination portion 90 and is thus useful. However, avalanche breakdown may occur near the front surface 12 if the electric field E of the resistive film 40 exceeds the dielectric breakdown electric field strength of the semiconductor substrate 10.

If the avalanche breakdown occurs, the semiconductor device 100 cannot maintain an original withstand voltage. In this manner, the withstand voltage of the semiconductor substrate 10 may decrease due to the shape of the taper portion 36. The larger the taper angle of the taper portion 36, the stronger the electric field E directly beneath the taper portion 36. As described later in detail, the inventor of the present application has found that the decrease in withstand voltage can be reduced more when the taper angle of the taper portion 36 of the insulating film 30 is 60 degrees or less compared to when such taper angle is larger than 60 degrees.

In one example, the upper end 37 and the lower end 38 of the taper portion 36 are separated, in a direction parallel to the front surface 12 of the semiconductor substrate 10, from the outer end portion 22 of the well region 20 by a quarter or more of the distance between the outer end portion 22 of the well region 20 of the active portion 80 and the inner end portion 54 of the outer edge region 50. As described later in detail, this can effectively reduce the decrease in withstand voltage.

Figure 3A:
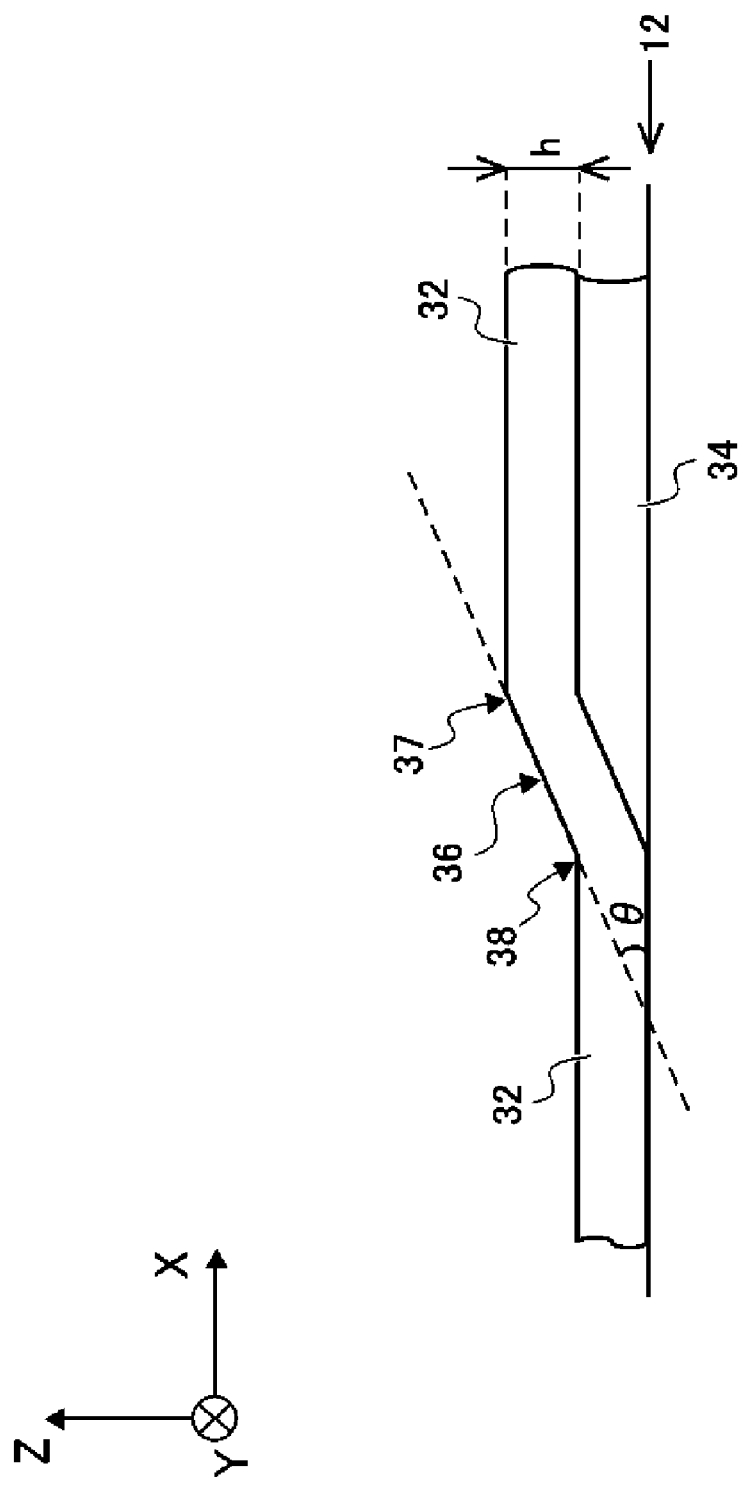
FIG. 3A is an enlarged view of an insulating film 30 in an edge termination portion 90.
Figure 3B:
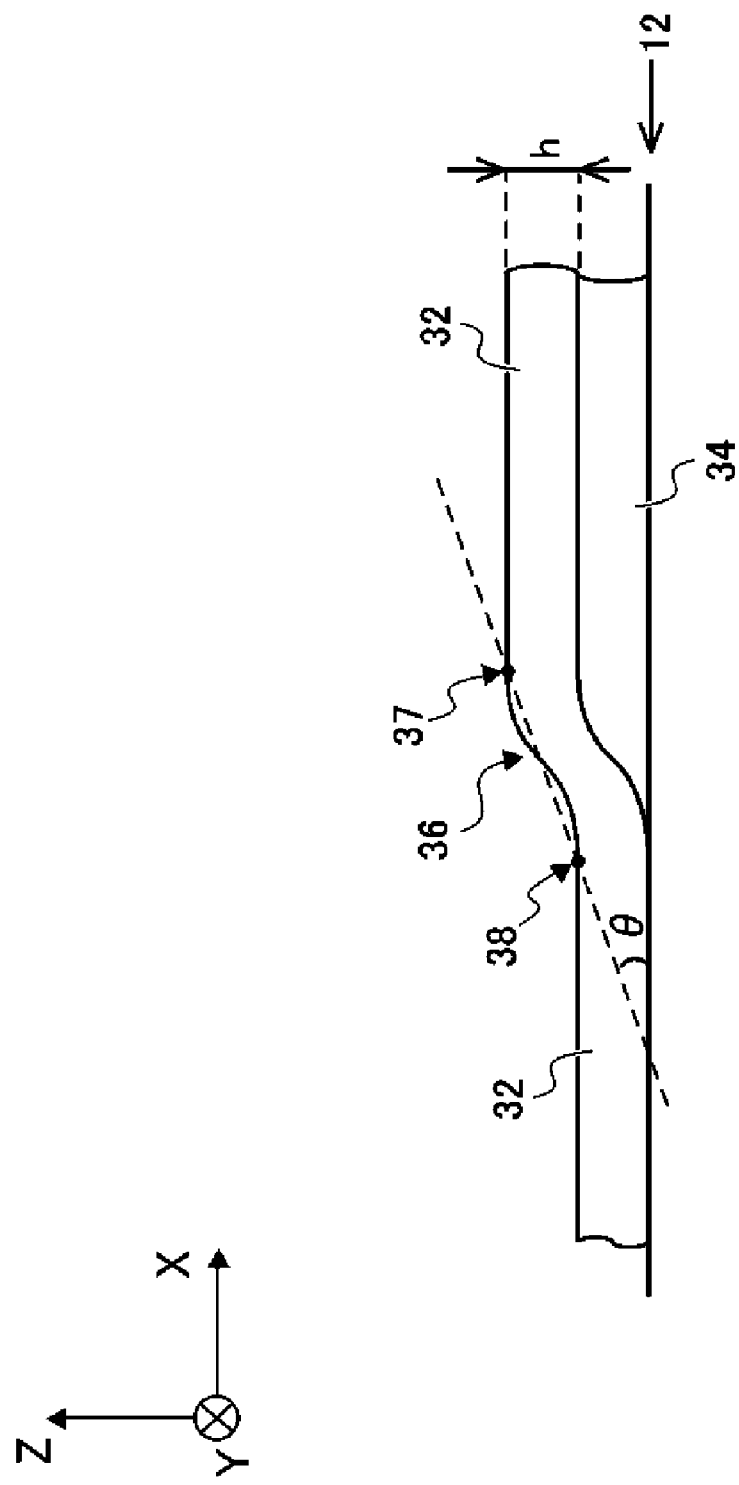
FIG. 3B is an enlarged view of the insulating film 30 in the edge termination portion 90.
Figure 3C:
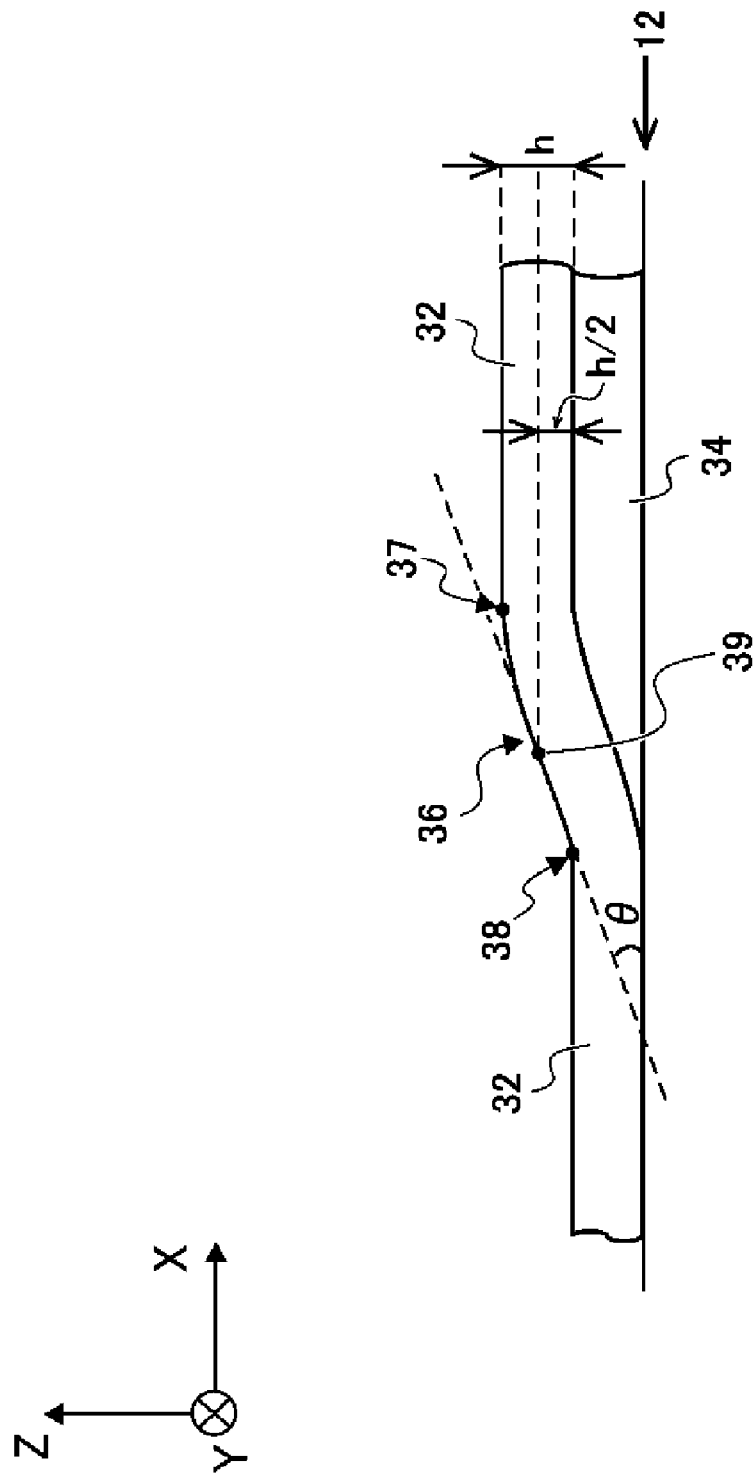
FIG. 3C is an enlarged view of the insulating film 30 in the edge termination portion 90.

FIGS. 3A to 3C are enlarged views of the insulating film 30 in the edge termination portion 90. Hatching over the insulating film 30 is omitted for the purpose of making the drawings easy to see. FIG. 3A shows the taper portion 36 having a linear slope. For example, the taper portion 36 formed by dry etching tends to have the linear slope. In FIG. 3A, the angle formed by a line connecting the upper end 37 and the lower end 38 of the taper portion 36 and the front surface 12 of the semiconductor substrate 10 is defined as the taper angle θ of the taper portion 36.

In the edge termination portion 90, the front surface 12 may be considered to be flat. When the front surface 12 is flat, the upper front surface of the second insulating film 34 provided so as to directly contact the front surface 12 may also be considered to be flat. In the present example, the expression "the front surface 12 is flat" means, in light of the thickness of the first insulating film 32 described later, that the difference between the maximum height and the minimum height of the edge termination portion 90 is 0.2 μm or less. In this case, the taper angle θ of the taper portion 36 may be defined as the angle formed by the line connecting the upper end 37 and the lower end 38 and the upper front surface of the second insulating film 34.

The thickness h of the first insulating film 32 is primarily the thickness of the first insulating film 32 on the front surface 12 of the semiconductor substrate 10 or on the second insulating film 34. The thickness h may be defined by the difference between the height position of the lower end 38 and the height position of the upper end 37. The thickness h of the first insulating film 32 may be 0.5 μm or more. For example, the thickness h of the first insulating film 32 is a predetermined thickness of 0.8 μm or more and 1.0 μm or less. In the first embodiment, the first insulating film 32 and the second insulating film 34 respectively have a thickness of 1.0 μm.

When the first insulating film 32 has the thickness h of 0.5 μm or more, control of the taper angle θ and reduction of the electric field intensity directly beneath the taper portion 36 may have a correlation therebetween. For example, when the thickness h is 0.5 μm or more, the electric field intensity directly beneath the taper portion 36 can be decreased by decreasing the taper angle θ. In the first embodiment, since the thickness h of the first insulating film 32 is 0.5 μm or more, setting the taper angle θ to 60 degrees or less can effectively reduce the electric field intensity directly beneath the taper portion 36.

When the thickness h is 0.5 μm or more, the control of the taper angle θ and the reduction of the electric field intensity directly beneath the taper portion 36 have a similar correlation therebetween irrespective of whether the thickness his 0.5 μm or 1 μm. Conversely, when the thickness h of the first insulating film 32 is thinner than 0.5 μm, the control of the taper angle θ and the reduction of the electric field intensity have almost no correlation therebetween irrespective of whether the taper angle θ is set to 60 degrees or less or to 60 degrees or more.

FIG. 3B shows the taper portion 36 that is a smooth curved surface. That is, FIG. 3B shows the taper portion 36 that has a lower portion smoothly connected to the front surface 12 of the semiconductor substrate 10, and an upper portion smoothly connected to the upper portion of the second insulating film 34. For example, the taper portion 36 formed by wet etching tends to be the smooth curved surface.

Also in FIG. 3B, the angle formed by the line connecting the upper end 37 and the lower end 38 of the taper portion 36 and the front surface 12 of the semiconductor substrate 10 may be the taper angle θ of the taper portion 36. Also, as described above, when the upper front surface of the second insulating film 34 is flat, the taper angle θ of the taper portion 36 may be defined as the angle formed by the line connecting the upper end 37 and the lower end 38 and the upper front surface of the second insulating film 34.

Similarly to FIG. 3B, FIG. 3C shows the taper portion 36 that is a smooth curved surface. However, FIG. 3C shows an example in which the upper end 37 is, in the outer direction, located further than in FIG. 3B and in which the front surface of the taper portion 36 is more flat than that in FIG. 3B.

In the example in FIG. 3C, the angle formed by the tangent of the taper portion 36 at the midpoint 39 (i.e., a height position of h/2) between the height position of the upper end 37 and the height position of the lower end 38 and the front surface 12 of the semiconductor substrate 10 may be regarded as the taper angle θ of the taper portion 36. As described above, when the upper front surface of the second insulating film 34 is flat, the taper angle θ of the taper portion 36 may be defined as the angle formed by the tangent of the taper portion 36 at the midpoint 39 and the upper front surface of the second insulating film 34.

In FIGS. 3A to 3C, it is not intended that the taper angle θ may be defined arbitrarily. FIGS. 3A to 3C show by example that there are multiple methods of appropriately evaluating the slope of the taper portion 36.

Figure 4:
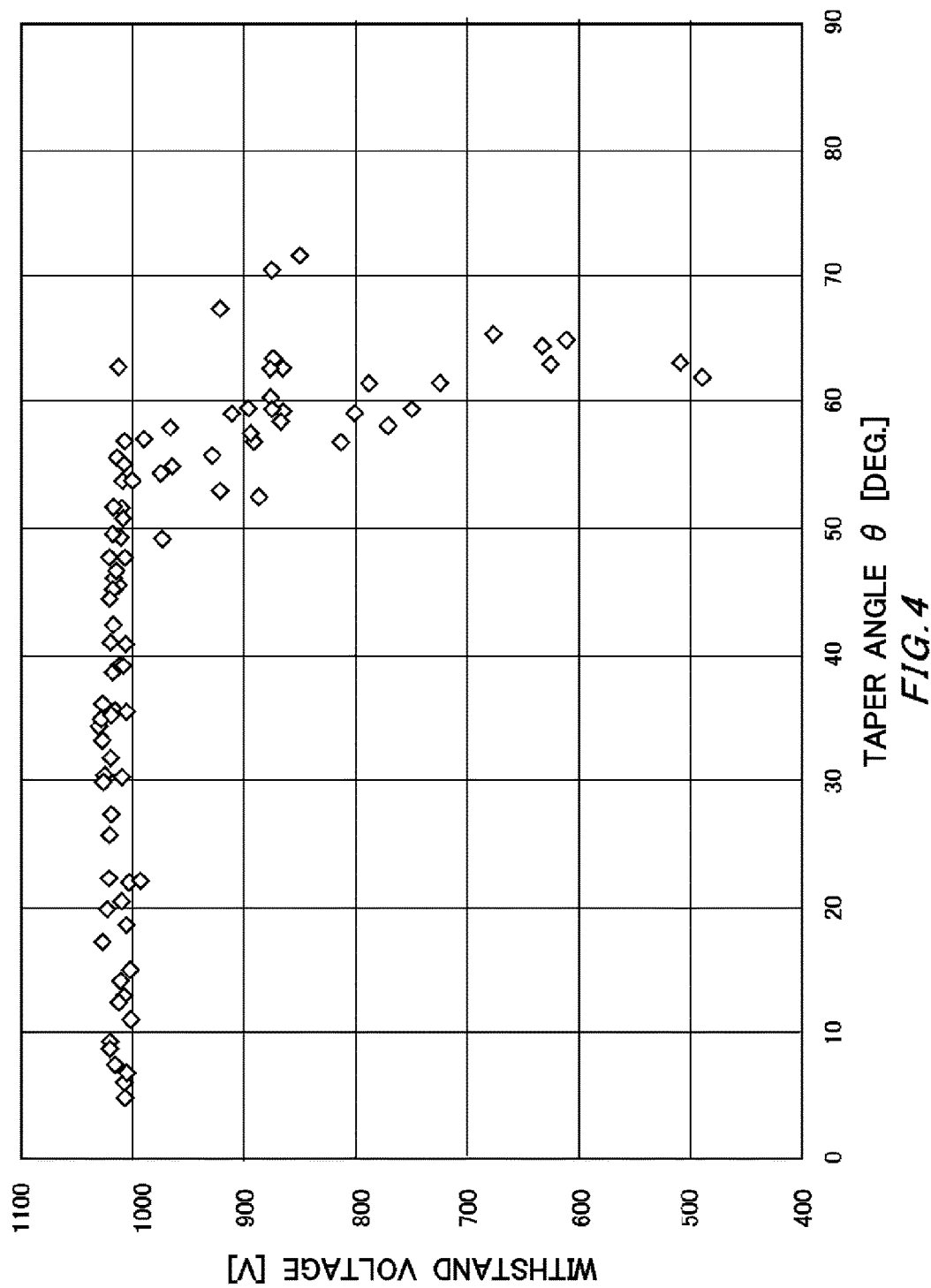
FIG. 4 is a diagram showing the relationship between the taper angle θ and the withstand voltage in the semiconductor device 100.

FIG. 4 is a diagram showing the relationship between the taper angle θ and the withstand voltage in the semiconductor devices 100. The horizontal axis indicates the taper angle θ [deg.] of the taper portion 36. The vertical axis indicates the withstand voltage [V] measured when a reverse bias was applied to the semiconductor devices 100. FIG. 4 shows the experimental results of measuring withstand voltages respectively corresponding to multiple different taper angles θ.

When the taper angle θ was larger than 60 degrees, some of the semiconductor devices 100 had a withstand voltage of less than 550 M. As described above, when the taper angle θ was larger than 60 degrees, the decrease in withstand voltage was significant. It is thus desirable to set the taper angle θ to 60 degrees or less.

Also, when the taper angle θ was larger than 50 degrees, some of the semiconductor devices 100 had a withstand voltage of less than 900 [V]. To prevent such decrease in withstand voltage, the taper angle θ may be set to 50 degrees or less.

When the taper angle θ was 48 degrees or less, a significant decrease in withstand voltage was not measured. That is, when the taper angle θ was 48 degrees or less, a rated withstand voltage could be maintained. It can thus be said that an especially large effect of preventing the decrease in withstand voltage can be achieved when the taper angle θ is 48 degrees or less. Accordingly, the taper angle θ may be set to 48 degrees or less, 45 degrees or less, or 40 degrees or less.

Figure 5:
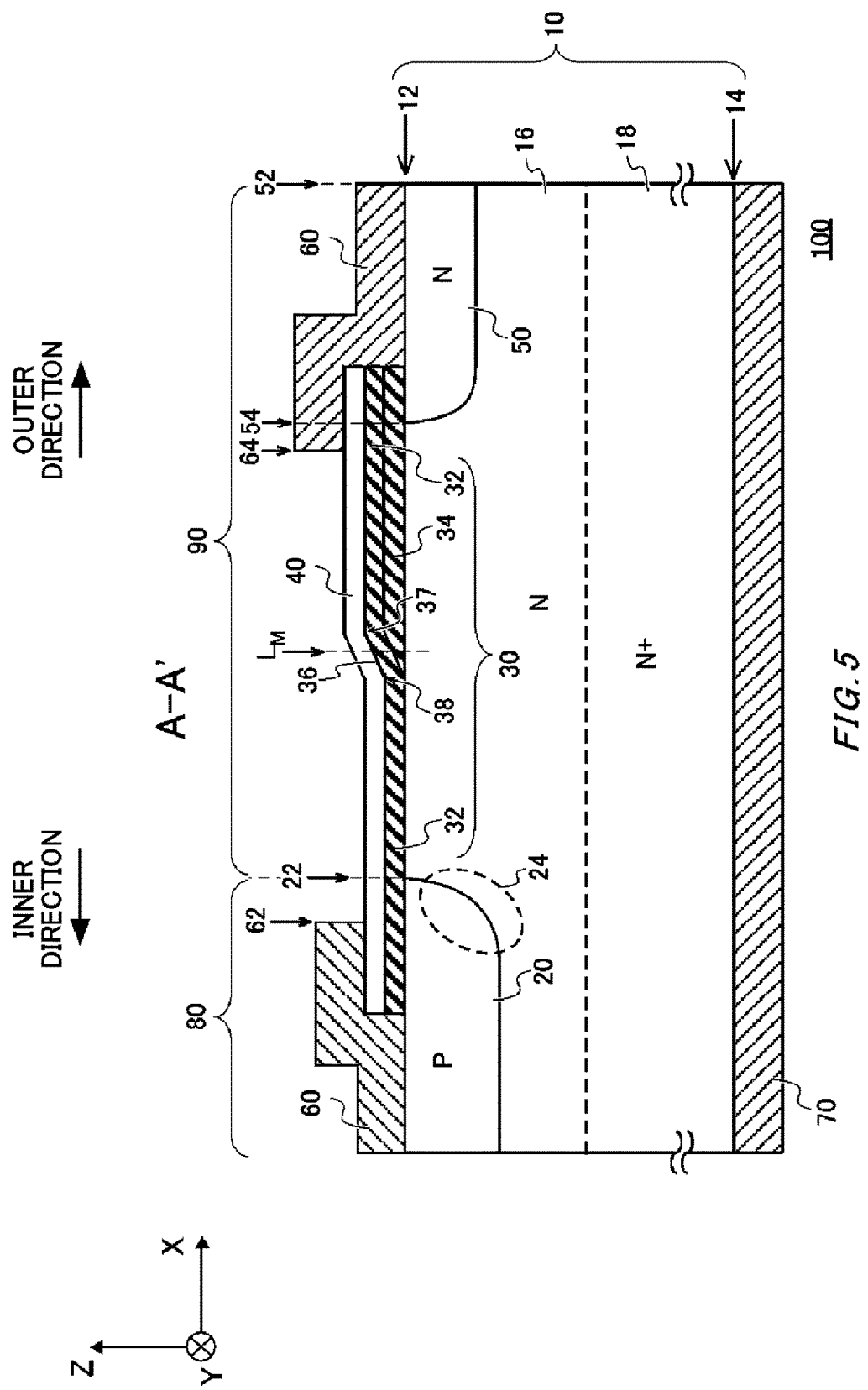
FIG. 5 is a diagram showing a cross section taken along A-A' according to a second embodiment.

FIG. 5 is a diagram showing a cross section taken along A-A' according to a second embodiment. The taper portion 36 of the present example has the same shape as that in the first embodiment, and is located further in the outer direction compared to the location in the first embodiment. More specifically, the upper end 37 of the taper portion 36 is, in a direction parallel to the X-axis direction, closer to the outer edge region 50 than to an intermediate position $L_M$. Also, the lower end 38 of the taper portion 36 is closer to the well region 20 than to the intermediate position $L_M$. The second embodiment is different from the first embodiment in that respect. The second embodiment is the same as the first embodiment in other respects. The intermediate position $L_M$ refers to the intermediate position between the outer end portion 22 of the well region 20 and the inner end portion 54 of the outer edge region 50.

A curved region 24 near the outer end portion 22 of the well region 20 may be a region into which currents flowing from the back surface 14 toward the front surface 12 concentrate. For example, when the curved region 24 of the well region 20 is a region near the end portion of the P-type body region of the FWD in the outer direction, the currents concentrate into the curved region 24 if the reverse bias is applied to the semiconductor device 100. In the present example, making the taper portion 36 separate from the well region 20 allows the curved region 24 into which currents concentrate and the taper portion 36 with a strong electric field to be separated from each other in the direction parallel to the X-axis direction. This can reduce the decrease in withstand voltage more effectively compared to when the upper end 37 and the lower end 38 of the taper portion 36 are separated from the outer end portion 22 by a quarter of the distance between the outer end portion 22 of the well region 20 and the inner end portion 54 of the outer edge region 50.

Figure 6:
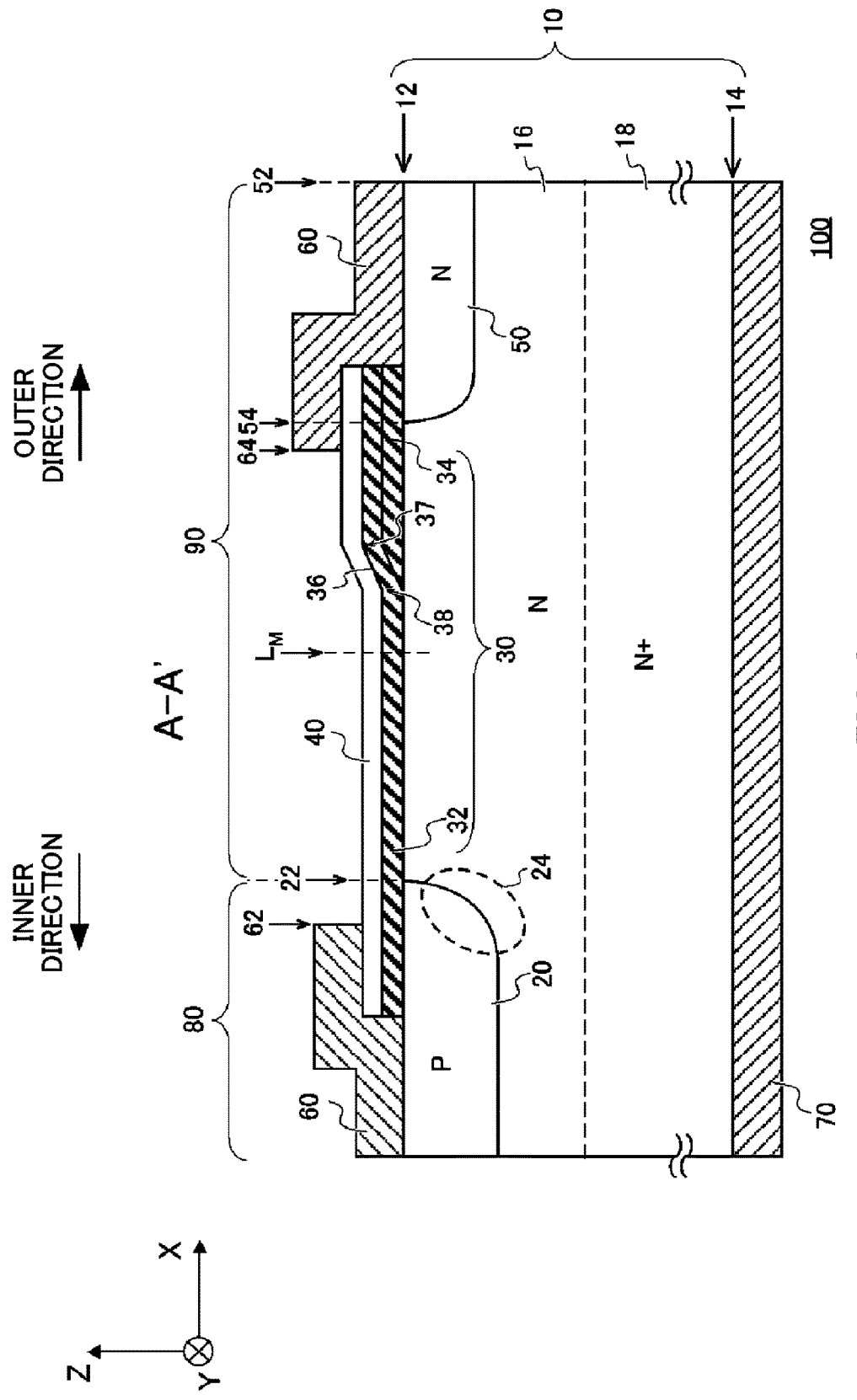
FIG. 6 is a diagram showing a cross section taken along A-A' according to a third embodiment.

FIG. 6 is a diagram showing a cross section taken along A-A' according to a third embodiment. In the present example, in addition to the upper end 37 of the taper portion 36, the lower end 38 of the taper portion 36 is, in the direction parallel to the X-axis direction, closer to the outer edge region 50 than to the intermediate position $L_M$. This allows the taper portion 36 to be further separated from the well region 20 compared to that in the first and second embodiments, which in turn makes it possible to further effectively reduce the decrease in withstand voltage.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the such that and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE NUMERALS

10: semiconductor substrate; 12: front surface; 14: back surface; 16: drift region; 18: collector region; 20: well region; 22: outer end portion; 24: curved region; 30: insulating film; 32: first insulating film; 34: second insulating film; 36: taper portion; 37: upper end; 38: lower end; 39: midpoint; 40: resistive film; 50: outer edge region; 52: outer end portion; 54: inner end portion; 60: front surface electrode; 62: outer end portion; 64: inner end portion; 70: back surface electrode; 80: active portion; 90: edge termination portion; 100: semiconductor device

What is claimed is:

1. A semiconductor device comprising:
   a semiconductor substrate, the semiconductor substrate having:
      an edge termination portion including an outer edge region, the outer edge region being provided on an end portion of a front surface of the semiconductor substrate and within a predetermined depth range and being an impurity region; and
      an active portion including a well region, the well region being provided on an inner side relative to the outer edge region of the front surface of the semiconductor substrate and within a predetermined depth range and being an impurity region whose conductivity-type is different from that of a drift region of the semiconductor substrate,
   the semiconductor device further comprising:
   an insulating film provided on the front surface of the semiconductor substrate and at least between the outer edge region and the well region and having a taper portion; and
   a resistive film provided on the insulating film and electrically connected to the outer edge region and the well region, wherein
   a taper angle of the taper portion of the insulating film is 60 degrees or less.

2. The semiconductor device according to claim 1, wherein a thickness of the insulating film on the front surface of the semiconductor substrate is 0.5 μm or more.

3. The semiconductor device according to claim 1, wherein an upper end and a lower end of the taper portion are separated, in a direction parallel to the front surface of the semiconductor substrate, from an outer end portion of the well region by a quarter or more of a distance between the outer end portion of the well region of the active portion and an inner end portion of the outer edge region.

4. The semiconductor device according to claim 1, wherein an upper end of the taper portion is, in a direction parallel to the front surface of the semiconductor substrate, closer to the outer edge region than to an intermediate position between an outer end portion of the well region of the active portion and an inner end portion of the outer edge region.

5. The semiconductor device according to claim 1, wherein a lower end of the taper portion is, in a direction parallel to the front surface of the semiconductor substrate, closer to the outer edge region than to an intermediate position between an outer end portion of the well region of the active portion and an inner end portion of the outer edge region.

6. The semiconductor device according to claim 1, wherein the insulating film includes a first insulating film having the taper portion, and a second insulating film located between the first insulating film and the front surface of the semiconductor substrate.

7. The semiconductor device according to claim 1, wherein
   an inner end portion of the insulating film extends in an inner direction relative to an outer end portion of the well region, and
   an outer end portion of the insulating film extends in an outer direction relative to an inner end portion of the outer edge region.

* * * * *